(12) United States Patent
Takahashi et al.

(10) Patent No.: US 7,312,733 B2
(45) Date of Patent: Dec. 25, 2007

(54) SEMICONDUCTOR APPARATUS WITH AN ANALOG-TO-DIGITAL CONVERTER AND AMPLIFIER

(75) Inventors: Yoichi Takahashi, Yamagata (JP); Tomotake Ooba, Yamagata (JP); Fujio Higuchi, Yamagata (JP); Akira Saitou, Yamagata (JP); Keiichi Iwazumi, Yamagata (JP); Keiko Kobayashi, Yamagata (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/246,256

(22) Filed: Oct. 11, 2005

(65) Prior Publication Data

US 2006/0077089 A1   Apr. 13, 2006

(30) Foreign Application Priority Data

Oct. 12, 2004   (JP) ............................. 2004-298239

(51) Int. Cl.
*H03M 1/06* (2006.01)
(52) U.S. Cl. ..................................... 341/118; 341/155
(58) Field of Classification Search ................ 341/155, 341/118, 120
See application file for complete search history.

(56) References Cited

U.S. PATENT DOCUMENTS

| | | | | |
|---|---|---|---|---|
| 4,996,529 | A | * | 2/1991 | Connell ...................... 341/118 |
| 5,121,119 | A | * | 6/1992 | Higuchi et al. ............. 341/120 |
| 5,144,310 | A | * | 9/1992 | Sato ............................ 341/161 |
| 5,179,379 | A | * | 1/1993 | Allen et al. ................. 341/118 |
| 5,293,166 | A | * | 3/1994 | Ta ............................... 341/118 |
| 5,691,720 | A | * | 11/1997 | Wang et al. ................. 341/143 |
| 5,821,795 | A | * | 10/1998 | Yasuda et al. .............. 327/307 |
| 6,219,107 | B1 | * | 4/2001 | Renner et al. .............. 348/678 |
| 6,515,602 | B2 | * | 2/2003 | Ahn et al. ................... 341/139 |
| 6,603,416 | B2 | * | 8/2003 | Masenas et al. ............ 341/120 |
| 6,762,706 | B2 | * | 7/2004 | Fong et al. ................. 341/155 |
| 6,888,482 | B1 | * | 5/2005 | Hertle ......................... 341/120 |
| 2006/0077088 | A1 | * | 4/2006 | Matsui et al. ............... 341/155 |

FOREIGN PATENT DOCUMENTS

| | | |
|---|---|---|
| JP | 58-127429 | 7/1983 |
| JP | 5-248975 | 9/1993 |
| JP | 06-169255 | 6/1994 |
| JP | 06-334523 | 12/1994 |
| JP | 2000-188548 | 7/2000 |
| JP | 2004-147326 | 5/2004 |

OTHER PUBLICATIONS

Japanese Office Action dated Oct. 23, 2006 with a partial English translation.

* cited by examiner

*Primary Examiner*—Peguy JeanPierre
(74) *Attorney, Agent, or Firm*—McGinn IP Law Group, PLLC

(57) ABSTRACT

A semiconductor apparatus includes an amplifying unit, a bias controlling unit, an AD converting unit and a controlling unit. The amplifying unit is configured to amplify an input signal to output an amplified signal. The bias controlling unit is configured to generate a bias voltage to be applied to the input signal. The AD converting unit is configured to AD-convert the amplified signal into an output signal. The controlling unit is configured to output a control signal to the bias controlling unit. The controlling unit outputs the control signal when an output value indicated by the output signal is equal to a predetermined value. The bias controlling unit changes the bias voltage in response to the control signal.

14 Claims, 12 Drawing Sheets

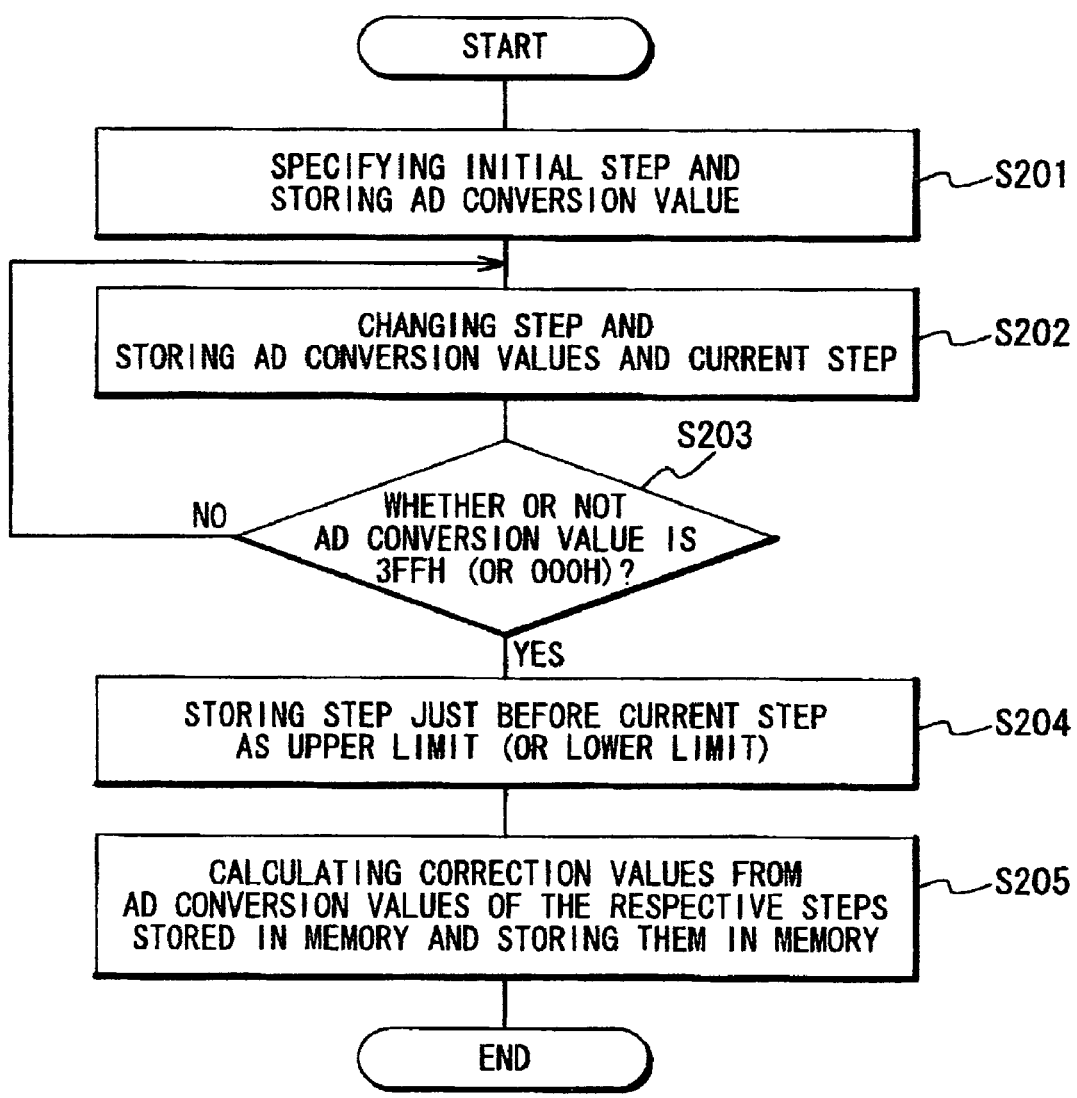

SEMICONDUCTOR APPARATUS WITH AN ANALOG-TO-DIGITAL CONVERTER AND AMPLIFIER

BACKGROUND OF THE INVENTION

1. Field of the Invention

The present invention relates to a semiconductor apparatus, and more particularly relates to a semiconductor apparatus for converting an analog signal into a digital data.

2. Description of the Related Art

In recent years, regulations with regard to the safety of a vehicle have been successively strengthened in Japan and the United States. According to the TREAD law (The Transportation Recall Enhancement, Accountability and Document Act) executed in North America, a new car that will be sold from 2006 onward will be obligated to mount a tire pressure monitoring system (hereinafter also referred to as TPMS). For this reason, the technique has been currently developed for mounting a sensor inside a tire to measure a tire pressure and an air temperature. This technique is related to the system that mounts a sensor unit in a valve portion of each tire and individually monitors all four wheels. Thus, this technique has an advantage that the monitoring with a high precision, the monitoring of the tire pressure during the stopping and parking of the car, and the like can be attained.

The foregoing sensor unit typically includes: a sensor; an amplifying apparatus for amplifying an output of the sensor; an AD converter for performing an AD conversion on an output of the amplifying apparatus; and a micro computer (a processing unit) for computing a sensor output data based on an output of the AD converter.

A TPMS represented by the TPMS having the foregoing sensor units uses a pressure sensor to measures a tire pressure of a tire. When the pressure sensor is used to monitor a state of a target (such as an tire pressure of a tire in the TPMS), at first, an amplifying circuit amplifies a weak voltage that is a potential difference between two analog signals outputted from the pressure sensors, and generates an amplification voltage. Next, an AD converting circuit converts the amplification voltage (an analog value) into an AD conversion value (a digital value) to enable the amplification voltage to be processed by the micro computer. Then, the AD converting circuit supplies the AD conversion value to the micro computer. The micro computer executes a predetermined computing process based on the AD conversion value to obtain a tire pressure data. Typically, the range of an input voltage that can be converted by the AD converting circuit is the range from 0 V (a ground potential of the AD converting circuit) to a reference voltage (Vref) applied to the AD converting circuit. For this reason, even if a voltage less than 0 V or a voltage more than the reference voltage (Vref) is supplied to the AD converting circuit, the AD converting circuit cannot output a correct AD conversion value. In short, with regard to the input voltage less than 0 V, the AD converting circuit outputs a constant digital value (typically, 0) corresponding to 0 V. On the other hand, with regard to the input voltage more than the reference voltage, the AD converting circuit outputs a constant digital value (typically, a maximum value that can be represented by a bit number of the AD conversion) corresponding to the reference voltage.

In the TPMS, the outputting of the monitored result with a high precision and reliability is required. Conventionally, in order to improve the reliability of the TPMS, a method is used in which the AD converting circuit having a high resolution is employed in the system. As one method of detecting the tire pressure with the high resolution, there is a method in which the weak voltage outputted by the pressure sensor is amplified by the amplifying circuit whose amplification factor is high and converted into the digital value by the AD converting circuit. As another method, there is a method that increases the number of bits in the AD conversion and consequently converts the weak input voltage into the digital value with the high resolution. Japanese Laid Open Patent Application (JP-A-Heisei, 5-248975) discloses a gain adjusting circuit of an amplifier for amplifying a signal of a pressure sensor. When an amplification factor of the amplifying circuit is made higher, the input voltage to the AD converting circuit is made higher. On the other hand, as mentioned above, the maximum value of the input voltage on which the AD converting circuit can perform the AD conversion is determined by the reference voltage. Thus, in order to correctly perform the AD conversion on the amplified input voltage, the reference voltage is required to be higher. With this conversion into the high voltage, when the AD converting circuit is built in the micro computer, it becomes difficult to make the operation voltage of the micro computer itself lower than the reference voltage.

On the other hand, when the method that increases the number of the bits in the AD conversion to improve the resolution is used as mentioned above, it is possible to avoid the reference voltage from being made higher. However, the increase in the number of the bits in the AD conversion increases the circuit scale of the AD converting circuit and finally leads to the increase in a chip area and the expensive cost. Depending on a case, it becomes difficult to build the AD converting circuit in the micro computer.

If a use environment temperature of the tire is largely changed, the tire pressure is also largely changed. Also, it is desired to be able to recognize a sign of a tire blowout by detecting the slight change of the tire pressure. Therefore, the AD converting circuit used in the TPMS is required to have both the performance for surely converting the output voltage of the pressure sensor, which is changed over a wide range, into the digital value, and having the high resolution at which the slight change in the output voltage of the pressure sensor can be detected.

SUMMARY OF THE INVENTION

In order to achieve an aspect of the present invention, the present invention provides a semiconductor apparatus including: an amplifying unit configured to amplify an input signal to output an amplified signal; a bias controlling unit configured to generate a bias voltage to be applied to the input signal; an AD converting unit configured to AD-convert the amplified signal into an output signal; and a controlling unit configured to output an control signal to the bias controlling unit, wherein the controlling unit outputs the control signal when an output value indicated by the output signal is equal to a predetermined value, and the bias controlling unit changes the bias voltage in response to the control signal.

In the present invention, the controlling unit can detect the fact that the output of the amplifying unit exceeds the input voltage range (conversion range) of the AD converting unit by detecting that the output value of the AD converting unit is equal to a predetermined value. Since the controlling unit controls the bias controlling unit to change the bias voltage, the output of the amplifying unit can be in the input voltage range of the AD converting unit on which the AD conversion can be normally performed. According to the present invention, it is possible to perform the AD conversion on the sensor output, which is slightly changed over the wide range, at the high precision without increasing the number of the bits in the AD conversion.

BRIEF DESCRIPTION OF THE DRAWINGS

The above and other objects, advantages and features of the present invention will be more apparent from the following description taken in conjunction with the accompanying drawings, in which:

FIG. 13 is a flowchart showing a preparing operation for the table in this embodiment.

DESCRIPTION OF THE PREFERRED EMBODIMENTS

Embodiments of a semiconductor apparatus according to the present invention will be described below with reference to the attached drawings. The following embodiment explains a case where a semiconductor apparatus of the present invention is applied to a TPMS (A Tire Pressure Monitoring System).

Figure 1:
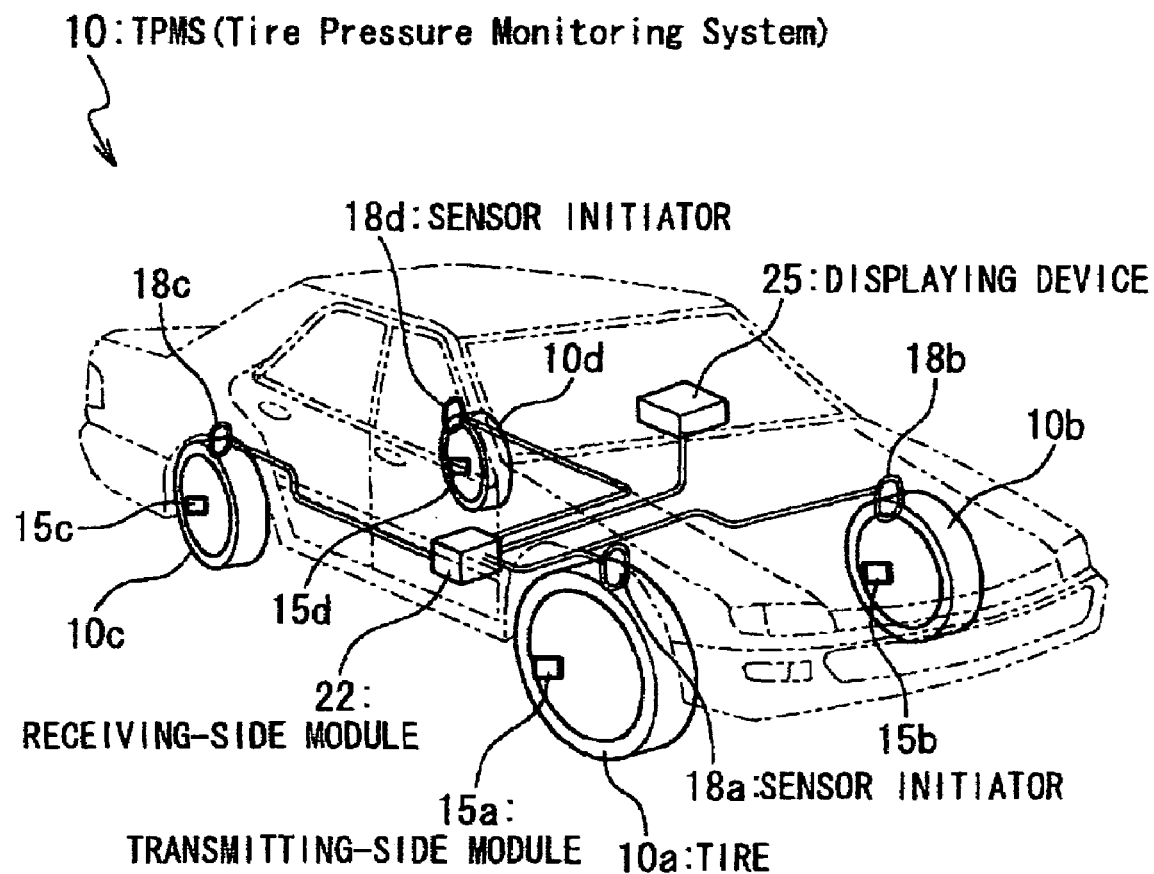
FIG. 1 is a schematic view showing the configuration of an embodiment of TPMS (Tire Pressure Monitoring System) according to the present invention.

At first, the schematic configuration of the TPMS will be explained with reference to FIG. 1. FIG. 1 is a schematic view showing a configuration of the embodiment of the TPMS in which a data communicating apparatus ("transmitting-side module" in this embodiment) having a semiconductor apparatus 1 according to the present invention.

A TPMS 10 includes: transmitting-side modules 15a, 15b, 15c and 15d; sensor initiators 18a, 18b, 18c and 18d; and a receiving-side module 22. The transmitting-side modules 15a, 15b, 15c to 15d are mounted inside tires 10a, 10b, 10c and 10d, respectively. The sensor initiators 18a, 18b, 18c and 18d are placed on a body side. The sensor initiators 18a, 18b, 18c and 18d correspond to the transmitting-side modules 15a, 15b, 15c and 15d, respectively.

Each of the transmitting-side modules 15a to 15d includes: several kinds of sensors; a transmitter; and a receiver. The several kinds of sensors are used for detecting properties related to the tire such as a tire pressure and a tire temperature. The transmitter is used for transmitting data signals obtained by the sensors to the receiving-side module 22 by using electric waves of RF (Radio Frequency). The receiver is used for receiving command data signals transmitted from the corresponding one of the sensor initiators 18a to 18d by using electric waves of LF (Low Frequency) Also, the receiving-side module 22 has signal-receiving functions such as receiving the data signals transmitted from the transmitting-side modules 15a to 15d and receiving the RF electric waves transmitted from a keyless entry system. The receiving-side module 22 is connected with a displaying device 25.

Figure 2:
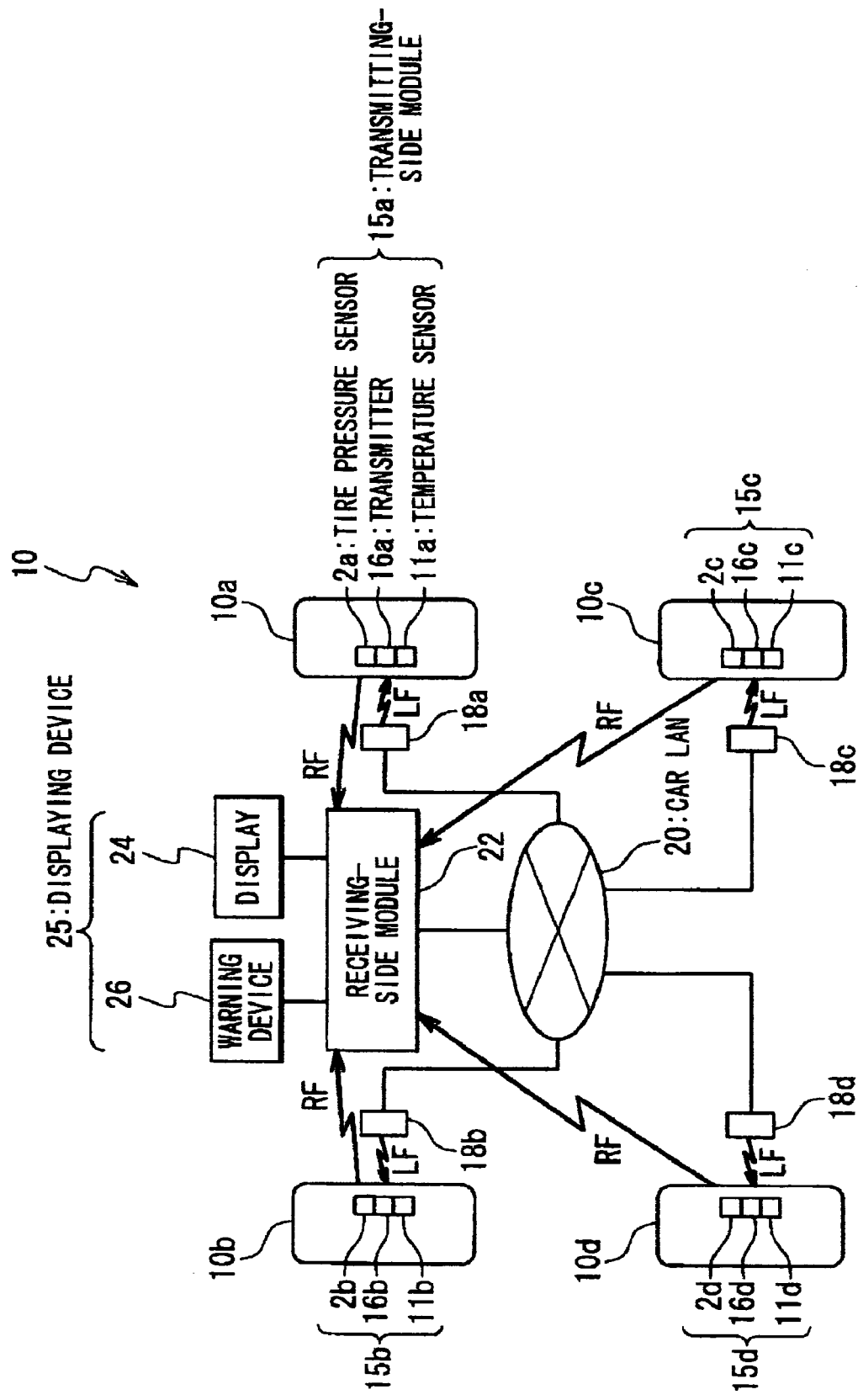
FIGS. 2 and 3 is block diagrams showing a configuration of the embodiment of the TPMS according to the present invention.
Figure 3:
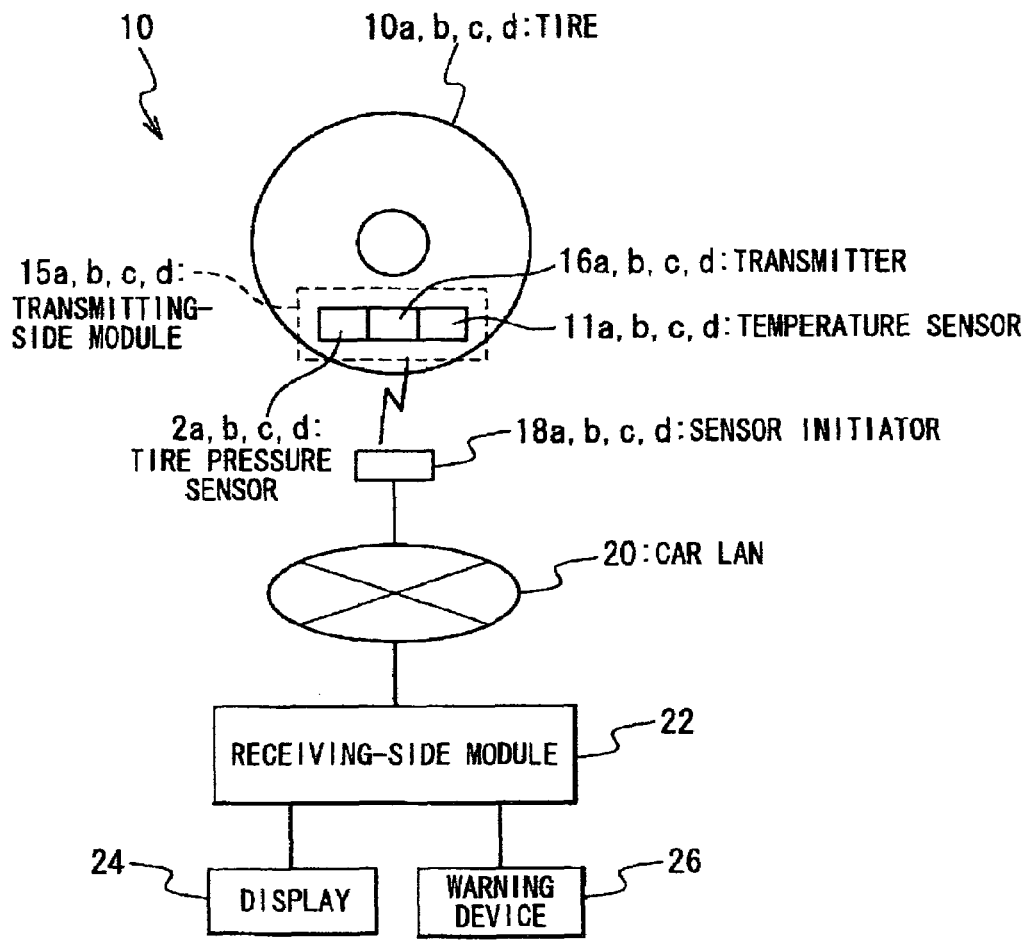

FIGS. 2 and 3 is block diagrams showing a configuration of the embodiment of the TPMS 10 according to the embodiment of the present invention. Also, FIG. 4 is a schematic view showing a wireless communication route in the TPMS 10 according to the embodiment of the present invention.

Figure 4:
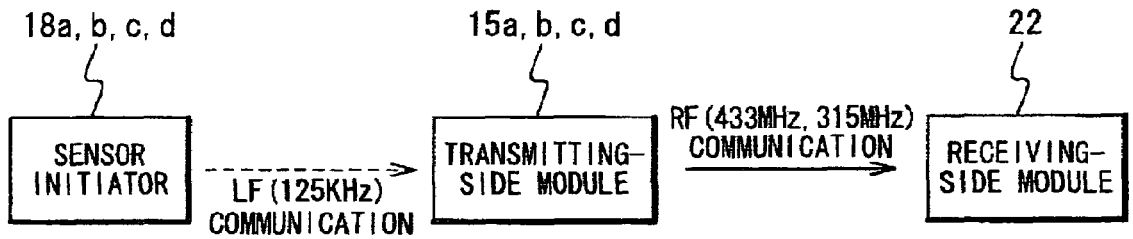
FIG. 4 is a schematic view showing a wireless communication route in the TPMS 10 in the embodiment according to the present invention.

With reference to FIGS. 2 to 4, the transmitting-side modules 15a to 15d are basically mounted in all tires 10a to 10d, respectively. The transmitting-side modules 15a to 15d include: tire pressure sensors 2a to 2d; temperature sensors 11a to 11d; and transmitters 16a to 16d, respectively. The transmitters 16a to 16d is used for transmitting the measurement data obtained by the sensors to the receiving-side module 22 by using the RF electric wave.

When a driver gets into a car, the driver transmits the RF electric wave for the keyless entry to the receiving-side module 22. When the receiving-side module 22 receives the RF electric wave for the keyless entry, the receiving-side module 22 transmits a command signal indicating activation through a car LAN 20 to the sensor initiators 18a to 18d. In response to the command signals, the sensor initiators 18a to 18d activate the transmitting-side modules 15a to 15d, respectively, by using the LF (ex. 125 kHz) electric wave. When the transmitting-side modules 15a to 15d are activated, the tire pressures and temperatures of the tires are immediately measured by the various sensors included in the transmitting-side modules 15a to 15d. Then, the transmitters 16a to 16d transmit the data obtained by the various sensors, as the data signals, to the receiving-side module 22 mounted on the body side by using the RF (ex. 433 MHz, 315 MHz) electric waves. The receiving-side module 22 reports the tire pressure data of the tires to the driver, by using the displaying device 25 (including a display 24 and a warning device 26) based on the data signals.

When the car starts running, the running of the car is sensed by a running detector (not shown) mounted in the tire. Then, for each predetermined time interval, or if an tire pressure or a temperature in the tire is fluctuated beyond the ruled value, the transmitters 16a to 16d of the transmitting-side modules 15a to 15d transmit the data signals indicative of the tire pressure and temperature data of the tires obtained by the tire pressure sensors 2a to 2d and temperature sensors 11a to 11d to the receiving-side module 22, by using the RF electric wave. Then, the data signals transmitted to the receiving-side module 22 are data-processed by a predetermined calculating process, and then transmitted through the car LAN 20 to the display 24 and the warning device 26. Thus, the tire pressure and temperature data of the tires are reported to the driver.

Figure 5:
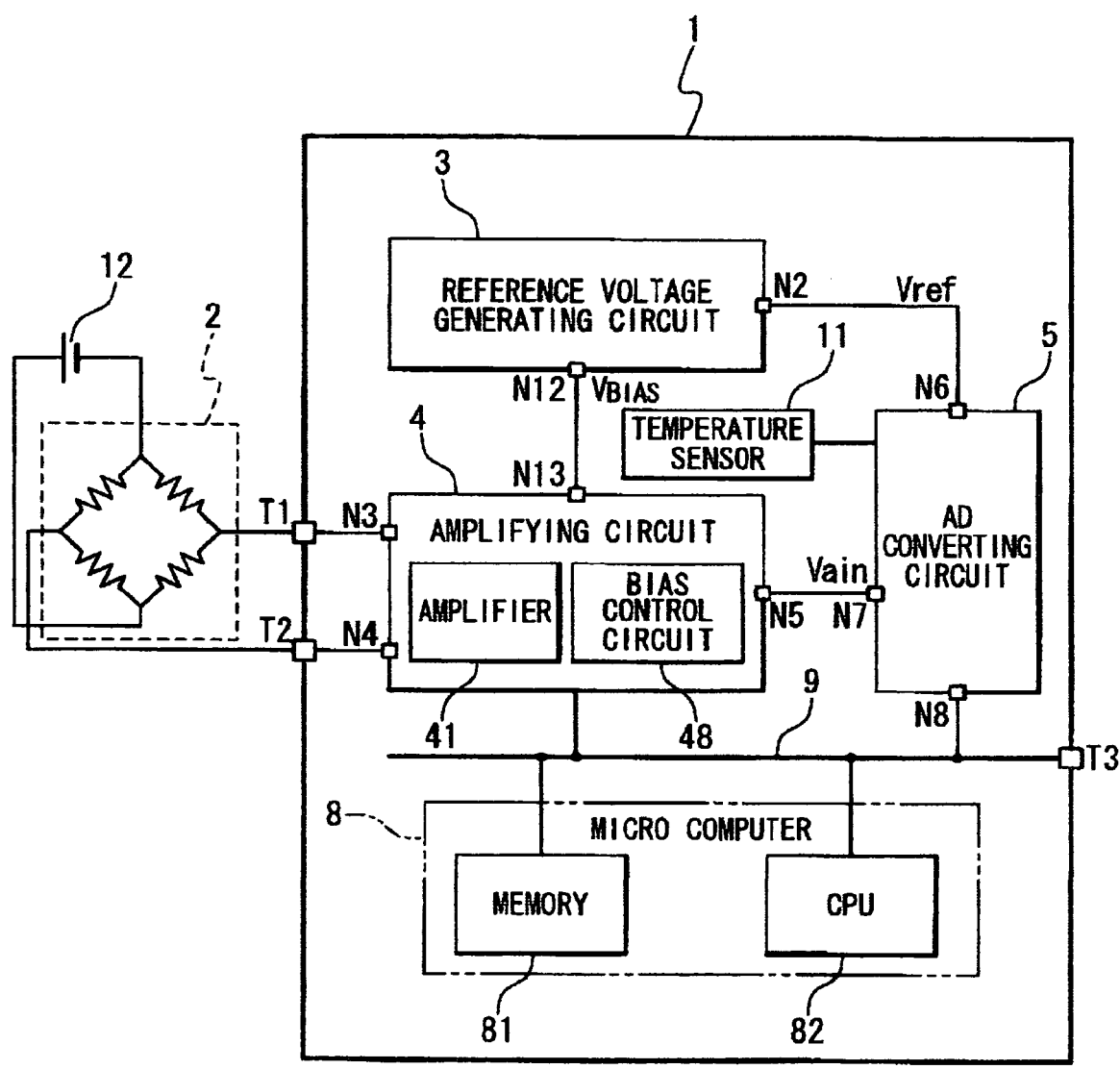
FIG. 5 is a block diagram showing a configuration of a semiconductor apparatus in the embodiment according to the present invention.

FIG. 5 is a block diagram showing the configuration of the semiconductor apparatus 1 in the embodiment according to the present invention. Each of the transmitting-side modules 15a to 15d further includes the semiconductor apparatus 1, which is connected with the corresponding one of the pressure sensors 2a to 2d (represented as "2" in FIG. 5) The pressure sensor 2 is the tire pressure sensor for detecting the tire pressure of the tire and included inside the tire. The pressure sensor 2 outputs a signal voltage as a sensor output in response to the detection of the tire pressure. As shown in FIG. 5, the semiconductor apparatus 1 has terminals T1 and T2, each receiving the signal voltage outputted from the pressure sensor 2. The semiconductor apparatus 1 amplifies the signal voltages received through the terminals T1 and T2, and then performs the AD conversion on the amplified signals. After that, the semiconductor apparatus 1 transmits the AD-converted amplified signals through an output terminal T3 to the receiving-side module 22.

As shown in FIG. 5, the semiconductor apparatus 1 includes a reference voltage generating circuit 3, an amplifying circuit 4, an AD converting circuit 5, a micro computer 8 and a temperature sensor 11. The reference voltage generating circuit 3 is the voltage generating circuit for generating voltages which is supplied to the amplifying circuit 4 and AD converting circuit 5. The reference voltage generating circuit 3 generates a reference voltage (Vref) supplied to the AD converting circuit 5 and also generates a bias voltage $V_{BIAS}$ supplied to the amplifying circuit 4. As shown in FIG. 5, the reference voltage generating circuit 3 has a node N2 and a node N12. The reference voltage Vref outputted from the node N2 is supplied through a node N6 to the AD converting circuit 5. Also, the bias voltage $V_{BIAS}$ outputted from the node N12 is supplied through a node N13 to the amplifying circuit 4. Preferably, the reference voltage generating circuit 3 is composed of a reference voltage generator and a bias voltage generator. The reference voltage generator is the voltage generating circuit for generating the voltage to be supplied to the AD converting circuit 5. The reference voltage generator is connected to a direct current power source and generates the reference voltage based on the voltage supplied from the direct current power source. Also, the reference voltage outputted from the reference voltage generator is supplied to the bias voltage generator. The bias voltage generator generates the bias voltage $V_{BIAS}$ through a resistance division and supplies the bias voltage $V_{BIAS}$ through the node N12 to the amplifying circuit 4. Since the bias voltage generator is configured as mentioned above, it is possible to configure the reference voltage generating circuit 3 for generating the bias voltage $V_{BIAS}$ correspondingly to the variation in the reference voltage Vref.

The amplifying circuit 4 is the amplifying circuit of the present invention. The amplifying circuit 4 amplifies and outputs the signal voltage supplied from the pressure sensor 2. The amplifying circuit 4 has nodes N3 and N4, and receives the signal voltages supplied from the pressure sensor 2 through the nodes N3 and N4. A voltage (analog signal) amplified by the amplifying circuit 4 is supplied through a node N5 to the AD converting circuit 5. Incidentally, the concrete circuit configuration of the amplifying circuit 4 will be described later.

The AD converting circuit 5 is the circuit for converting the analog signal supplied from the amplifying circuit 4 into a digital signal. In the following embodiment, it is assumed that the AD converting circuit 5 has a 10-bit resolution. However, this is not limited to this resolution of the AD converting circuit in the present invention. The AD converting circuit 5 receives the amplified voltage supplied from the amplifying circuit 4 through a node N7. The AD converting circuit 5 performs the AD conversion on the amplified voltage and outputs through a node N8 to the micro computer 8. Also, the AD converting circuit 5 performs the AD conversion on the signal voltage outputted from the temperature sensor 11.

The micro computer 8 is the integrated circuit included in the semiconductor apparatus 1. The micro computer 8 calculates the tire pressure (or temperature) of the tire based on the digital signal supplied from the AD converting circuit 5. The micro computer 8 outputs the calculated tire pressure (or temperature) as a tire pressure data signal (or a temperature data signal) from the terminal T3. The tire pressure data signal (or the temperature data signal) outputted from the terminal T3 is transmitted through the transmitting-side modules 15a to 15d to the receiving-side module 22 by using the RF electric wave. As shown in FIG. 5, the micro computer 8 is composed of a memory 81 and a CPU 82. The memory 81 is the storage device in which data can be read and written. In this embodiment, it is assumed that the memory 81 is a RAM (Random Access Memory). However, this is not limited to the configuration of the memory 81 in the present invention. For example, the memory 81 can be composed of non-volatile memories represented by an EEPROM. The CPU 82 is the arithmetic processing unit included in the micro computer 8. The CPU 82 executes the controls of the various devices included in the semiconductor apparatus 1 and the processing of the data received through a bus 9.

Figure 6:
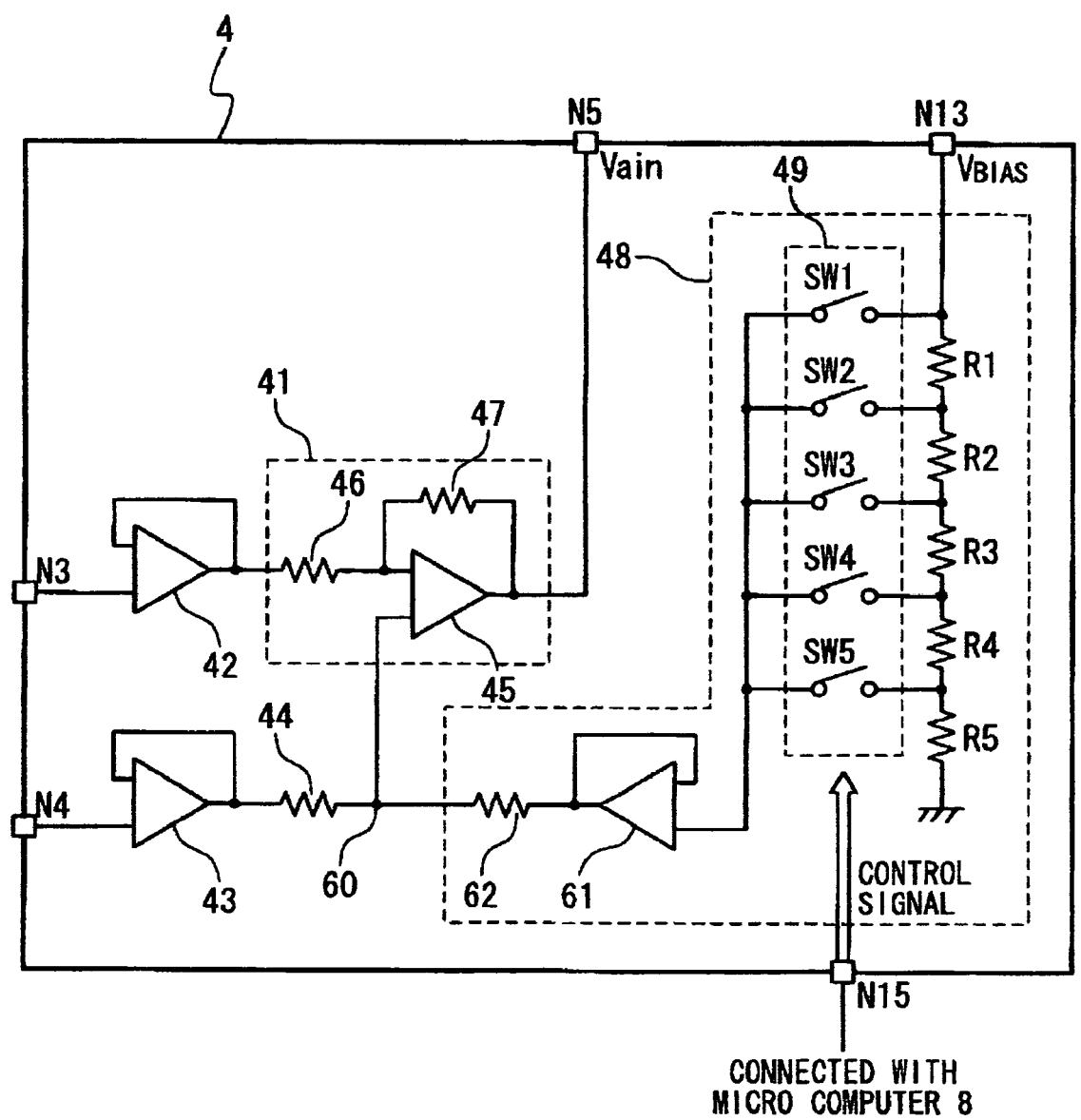
FIG. 6 is a circuit diagram showing the concrete circuit configuration of an amplifying circuit in the embodiment according to the present invention.

FIG. 6 is a circuit diagram showing the concrete circuit configuration of the amplifying circuit 4 in the embodiment according to the present invention. The amplifying circuit 4 is composed of an amplifier 41, a voltage follower 42, a voltage follower 43 and a bias control circuit 48. The signal voltage supplied from the pressure sensor 2 is sent through the nodes 3 and 4 to the voltage followers 42 and 43, respectively. An output of the voltage follower 42 is supplied through an amplifier first resistance 46 to an OP amplifier 45. Similarly, an output of the voltage follower 43 is supplied through a resistance 44 to the OP amplifier 45. An output of the OP amplifier 45 is connected to the node N5, and the amplifier 41 supplies the amplified signal through the node N5 to the AD converting circuit 5.

The amplifier 41 has the OP amplifier 45, the amplifier first resistance 46 and an amplifier second resistance 47. An amplification factor of the amplifier 41 is determined by a ratio between a resistance value of the amplifier first resistance 46 and a resistance value of the amplifier second resistance 47. In the following embodiment, it is assumed that the amplifier 41 is the amplifier for amplifying the signal voltage supplied from the pressure sensor 2 by a factor of 30. The bias control circuit 48 is the control circuit for variably controlling an amplified voltage (Vain) to be outputted to the AD converting circuit 5 in response to the control signal supplied from the micro computer 8 through a node N15. As shown in FIG. 6, the bias control circuit 48 is composed of: a switch group 49 having a plurality of switches (SW1 to SW5); a plurality of resistances (R1 to R5); a voltage follower 61 and a resistance 62. The switch group 49 switches the plurality of switches (SW1 to SW5) contained in the switch group 49, in response to the control signal supplied through the node N15. The bias control circuit 48 closes any switch in the switch group 49 in response to the control signal to generate a desirable bias voltage. The generated bias voltage is supplied through the voltage follower 61 to a node N60. The amplifying circuit 4 can change the output of the amplifier 41 in stepped manner by switching the switches in the switch group 49.

The foregoing bias voltage is applied to one of the output signals from the pressure sensor 2 that is supplied to the amplifier 41. Increasing or decreasing this bias voltage can increase or decrease the output voltage of the amplifier 41. When the output voltage of the pressure sensor 2 increases, there is a possibility that an AD conversion value (a digital value), into which the AD converting circuit 5 converts the output voltage of the amplifying circuit 4 in the bias voltage at that time, exceeds an upper limit value which can be represented by an AD conversion bit number. Even in this case, the AD conversion value becomes the upper limit value (for example, 3FFH when a conversion bit is a 10-bit). The control circuit 8, when detecting that the AD conversion value coincides with the upper limit value, instructs the bias control circuit 48 to switch a bias potential.

Figure 7:
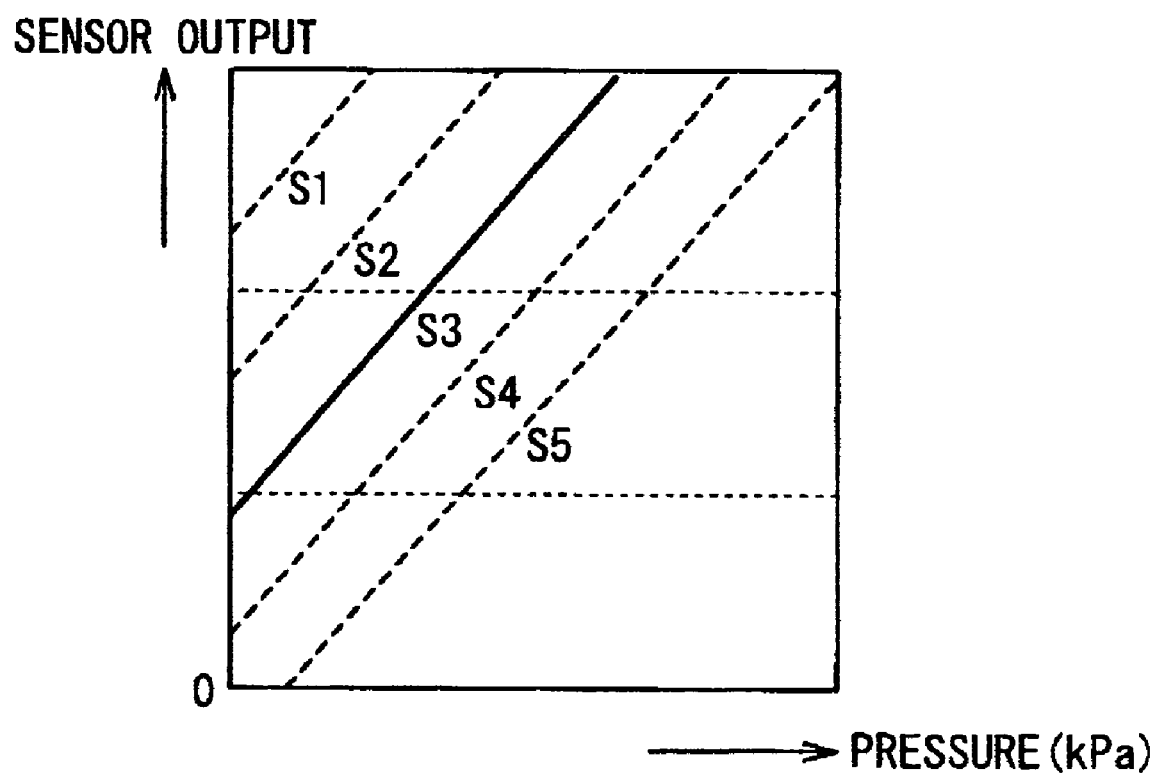
FIG. 7 is a view conceptually showing the change in the output from the amplifying circuit, when the plurality of switches in the switch group are switched in the embodiment according to the present invention.

FIG. 7 is a view conceptually showing the change in the output from the amplifying circuit 4, when the plurality of switches contained in the switch group 49 are switched. A lateral axis indicates the pressure (a unit: kPa), and a longitudinal axis indicates the sensor output (the output from the amplifying circuit 4). In a case that the pressure applied to the pressure sensor 2 is constant, when the switches in the switch group 49 are switched, the amplified voltage outputted from the amplifier 41 is changed in the stepped manner. In this way, since the amplified voltage is changed in the stepped manner, the conversion value outputted from the AD converting circuit 5 is also changed. A graph S1 shown in FIG. 7 represents a pressure value corresponding to the sensor output when the switch SW1 in the switch group 49 is turned on and the switches SW2 to SW5 are turned off. Similarly, a graph S2 represents the pressure value corresponding to the sensor output when the switch SW2 is turned on and the switch SW1, SW3 to SW5 are turned off. Similarly, a graph S3 represents the pressure value when the switch SW3 is turned on and the switches SW1, SW2, SW4 and SW5 are turned off. Similarly, a graph S4 represents the pressure value when the switch SW4 is turned on and the switches SW1 to SW3, and SW5 are turned off. Similarly, a graph S5 represents the pressure value when the switch SW5 is turned on and the switches SW1 to SW4 are turned off.

In this way, the switching between the switches (SW1 to SW5) in the switch group 49 enables the sensor output to be changed in the stepped manner, even if the signal voltage outputted from the pressure sensor 2 is constant. Thus, if the signal voltage outputted from the pressure sensor 2 is amplified to exceed the input voltage range (the range between 0V and the reference voltage (Vref)) in the AD converting circuit 5, the switching between the switches in the switch group 49 enables the AD converting circuit 5 to obtain the sensor output on which the AD conversion can be normally performed. For example, if the voltage supplied to the AD converting circuit 5 exceeds the reference voltage Vref, the AD converting circuit 5 outputs the AD conversion value corresponding to 3FFH (a 10-bit full scale). At this time, the micro computer 8 switches the switches in the switch group 49 of the bias control circuit 48 and instructs the amplifier 41 to output the amplified voltage in the range from 0V to the reference voltage (Vref). The micro computer 8 specifies a sensor output (a pre-correction AD conversion value) after the switching between the switches (SW1 to SW5). After that, the micro computer 8 refers to a table preliminarily stored in the memory 81 and extracts a correction value to correct the sensor output. The table stores the change amount when the steps (corresponding to SW1 to SW5) are changed, as the correction value, correspondingly to each step. The micro computer 8 specifies the step before the switching and the step after the switching, calculates the correction value that is the change amount, and adjusts to the pre-correction AD conversion value. Thus, the post-correction AD conversion value can be obtained. Incidentally, the detail of the table stored in the memory 81 will be described below.

Figure 8:
FIG. 8 is a table including correction values stored in a memory.

FIG. 8 is a table including the correction values stored in the memory 81. With reference to FIG. 8, the table 70 stores the sensor output at a constant pressure as a measurement value 71. Also, in the table, a case where the switch SW1 in the switch group 49 is on and the switches SW2 to SW5 are off is defined as a step 1, and the data at that time is stored therein as the measurement value 71 of the step 1. Similarly, a case where the switch SW2 is on and the other switches are off is defined as a step 2, and the data at that time is stored therein as the measurement value 71 of the step 2. A case where the switch SW3 is on and the other switches are off is defined as a step 3, and the data at that time is stored therein as the measurement value 71 of the step 3. A case where the switch SW4 is on and the other switches are off is defined as a step 4, and the data at that time is stored therein as the measurement value 71 of the step 4. A case where the switch SW5 is on and the other switches are off is defined as a step 5, and the data at that time is stored therein as the measurement value 71 of the step 5.

A correction value 72 of the table 70 is a correction data used to correct the sensor output. When the switching between the switches in the switch group 49 is executed, the correction value 72 is referred to based on the step before the switching and the step after the switching, and the correction value is specified. For example, since the voltage supplied to the AD converting circuit 5 at the step 1 exceeds the reference voltage Vref, when it is switched from the step 1 to the step 3, "0F0H" (=078H×2 step) is used as the correction value. Incidentally, the correction value indicated in the table 70 is uniform for each step. However, this does not limit the correction value in the present invention.

Figure 9:
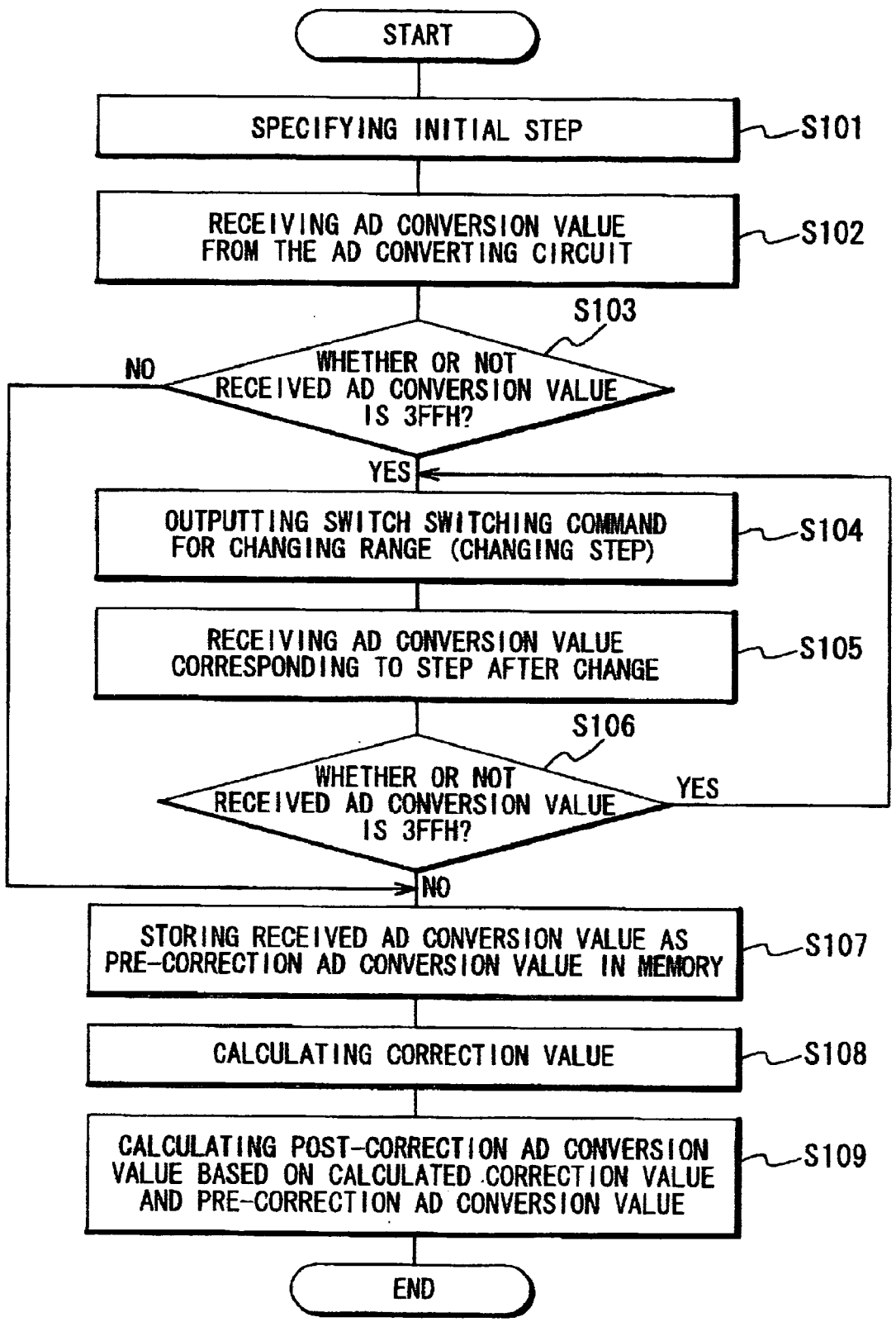
FIG. 9 is a flowchart showing the operation of the embodiment of the semiconductor apparatus according to the present invention.

FIG. 9 is a flowchart showing the operation of the embodiment of the semiconductor apparatus according to the present invention. The flowchart shows the correcting operation when the amplified voltage outputted from the amplifying circuit 4 exceeds the reference voltage Vref. As mentioned above, the AD converting circuit 5 in this embodiment has the 10-bit resolution. Thus, if an input voltage equal to or higher than the reference voltage Vref is supplied to the AD converting circuit 5, the AD converting circuit 5 is designed so as to output the AD conversion value corresponding to "3FFH" as the sensor output. Similarly, if an input voltage equal to or less than a ground voltage is supplied to the AD converting circuit 5, the AD converting circuit 5 outputs the AD conversion value corresponding to "000H" as the sensor output. Hence, if the amplified voltage outputted from the amplifying circuit 4 is equal to or less than the ground voltage, the correcting operation can be executed by controlling the switch group 49 so that it is shifted to an opposite direction at the time of the excess over the reference voltage Vref.

The operation in this embodiment is started in response to the operation of the TPMS 10. At a step S101, the micro computer 8 of the semiconductor apparatus 1 outputs a control signal for specifying an initial step of the switch group 49 to the amplifying circuit 4. The micro computer 8 stores the data (the initial step data) related to the initial step outputted from the amplifying circuit 4 in response to the control signal in the memory 81. The amplifying circuit 4 turns on a predetermined switch in response to the control signal. In this embodiment, although there is no limit to the specified initial step, middle steps in the plurality of steps are preferably set at the initial step. Thus, the output of the AD converting circuit 5 can be corrected upwardly and downwardly.

At a step S102, the micro computer 8 receives the output voltage (AD conversion value) supplied from the AD converting circuit 5 through the bus 9. The micro computer 8 executes a predetermined calculating process based on the received output voltage and generates a pressure data corresponding to the output voltage. At a step S103, the micro computer 8 judges whether or not the received AD conversion value is 3FFH. If the received AD conversion value is not 3FFH, the process proceeds to a step S107. If the received output voltage is 3FFH, the process proceeds to a step S104.

At the step S104, the micro computer 8 outputs the control signal (the switch switching command) for changing the range (step) to the amplifying circuit 4. The micro computer 8 stores the data (the switching step data) related to the step after the switching in the memory 81, in response to the output of the control signal. The amplifying circuit 4 turns off the current switch in response to the control signal and also turns on a new switch. There is no limit to the number of the switching steps in this embodiment. For example, the switch may be changed every one step, or the switch may be changed every two step.

At the step S105, the micro computer 8 receives the AD conversion value corresponding to the step after the change. The micro computer 8 receiving the AD conversion value proceeds to a step S106 in order to further judge whether or not the received AD conversion value is 3FFH. As the judged result, if the received AD conversion value is 3FFH, the process returns back to the step S104 and changes the range to a further next range. If the received AD conversion value is not 3FFH, the process proceeds to a step S107.

At the step S107, the micro computer 8 stores the AD conversion value corresponding to the output voltage received at the step S105 as the pre-correction AD conversion value in the memory 81. At a step S108, the micro computer 8 calculates the correction value to correct the pre-correction AD conversion value. The micro computer 8 specifies the initial step and the current step based on the initial step data and switching step data which are stored in the memory 81. After that, the micro computer 8 refers to the table 70 based on the specified initial step and current step and calculates the correction value.

At a step S109, the micro computer 8 calculates the post-correction AD conversion value based on the correction value calculated at the step S108. In the case of the foregoing operation, the micro computer 8 judges whether or not the specified AD conversion value is 3FFH and then executes the switching between the steps. In this case, the micro computer 8 adds the correction value calculated at the step S108 to the pre-correction AD conversion value and specifies the post-correction AD conversion value. The micro computer 8 calculates the final pressure data based on the post-correction AD conversion value and outputs through the output terminal T3.

As described above, in the present invention, the semiconductor apparatus 1 includes the amplifying circuit 4 having the bias control circuit 48, and the bias control circuit 48 is operated as mentioned above. Then, if the output of the amplifying circuit 4 exceeds the input voltage range of the AD converting circuit 5, the output of the amplifying circuit 4 is shift-controlled by the bias control circuit 48. Consequently, since the input voltage on which the AD conversion can be normally performed is applied to the AD converting circuit 5, the micro computer 8 can output the AD conversion value correctly reflecting the sensor output. The micro computer 8 corrects the AD conversion value based on the correction data stored in the memory 81. The micro computer 8, since generating the pressure data based on the corrected AD conversion value, can enlarge the conversion range of the AD converting circuit 5. For this reason, this is equivalent to the improvement of the resolution of the AD conversion circuit. Hence, the data of a high reliability can be supplied.

Figure 10:
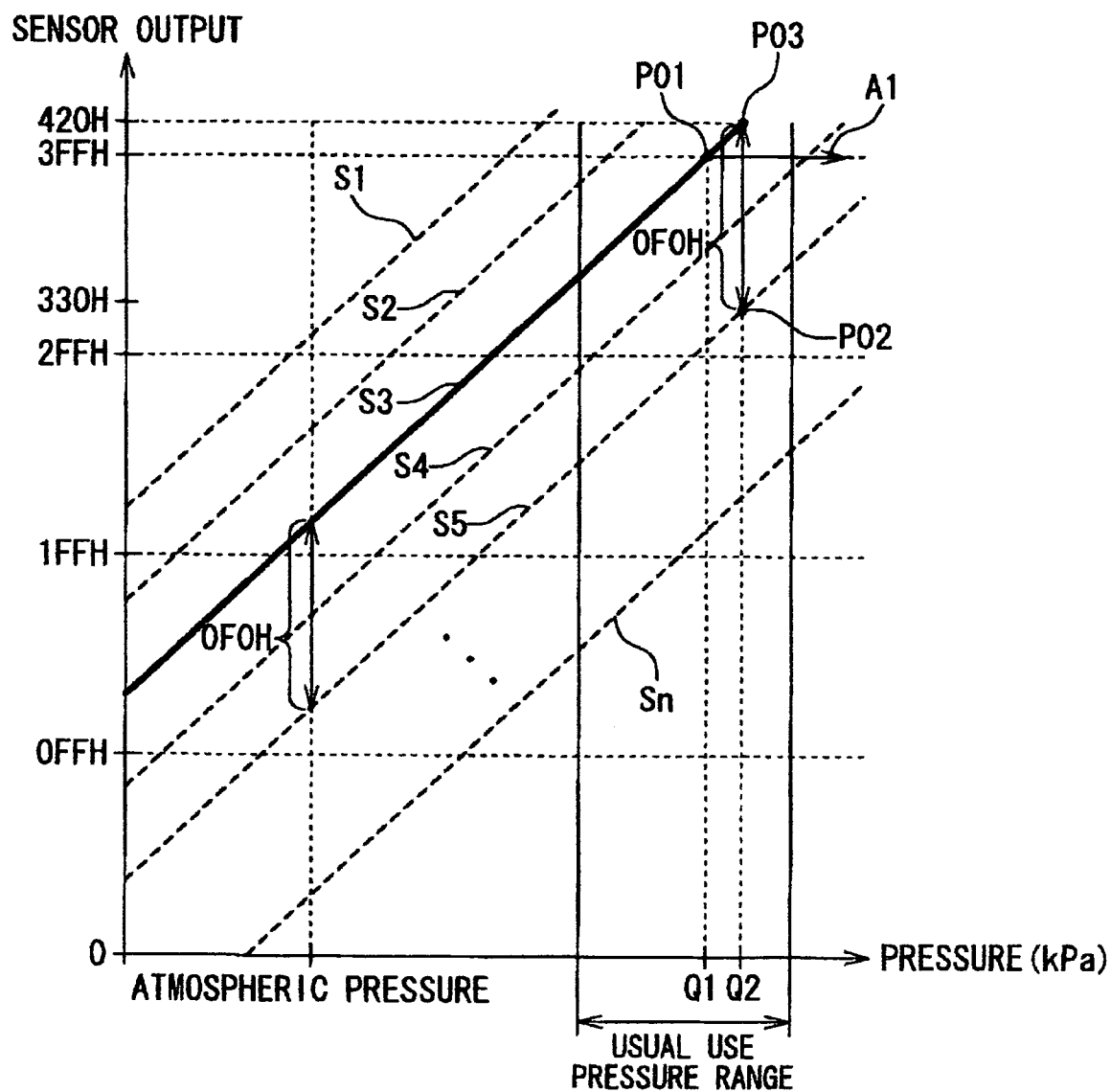
FIG. 10 is a graph exemplifying the operation in this embodiment.

FIG. 10 is a graph concretely showing the operations explained in FIG. 9. As described above, the AD converting circuit 5 included in the semiconductor apparatus 1 has the 10-bit resolution. The lateral axis indicates the pressure, and the longitudinal axis indicates the AD conversion value calculated based on the voltage outputted from the AD converting circuit 5. Also, graphs S1 to S5 shown in FIG. 10 correspond to the steps 1 to 5 of the table 70.

Here, as the initial step, let us suppose that the step 3 (graph S3) is selected. The micro computer 8 receives the output voltage supplied from the AD converting circuit 5 at any time. When the AD converting circuit 5 outputs the voltage indicating 3FFH as the AD conversion value, the micro computer 8 transiently specifies the pressure at that time (calculates a pressure value Q1 corresponding to a point P01). At this time, although the pressure value Q1 is calculated, there is a case that the actual pressure exceeds the pressure value Q1 (the range of an arrow A1 of FIG. 10). Thus, when the correction is not executed, there is a case that the actual pressure value exceeds the range of a usual use pressure.

The micro computer 8 responds to the fact that the AD conversion value is 3FFH, and outputs the control signal for executing the change of the range. Here, let us suppose that the control signal is the control signal for switching from the step 3 (graph S3) to the step 5 (graph S5). The amplifying circuit 4 turns off the switch SW3 in response to the control signal and also turns on the switch SW5. The micro computer 8 receives the output voltage from the AD converting circuit 5 at that state and specifies the AD conversion value (330H at a point P02). The micro computer 8 refers to the table 70, calculates the correction value (0F0H(=078H×2 steps)) corresponding to the case where the step is changed by two steps (from S3 to S5), and adds the correction value (0F0H) to the previously specified AD conversion value (330H).

The micro computer 8 specifies a point P03 based on a post-correction AD conversion value 420H obtained by the foregoing calculation and an inclination of the graph S3. The micro computer 8 outputs a pressure value Q2 corresponding to the point P03 as the pressure data. Consequently, when the voltage exceeding the reference voltage Vref is sent to the AD converting circuit 5, the range of the AD converting circuit can be changed to obtain the pressure data.

Figure 11:
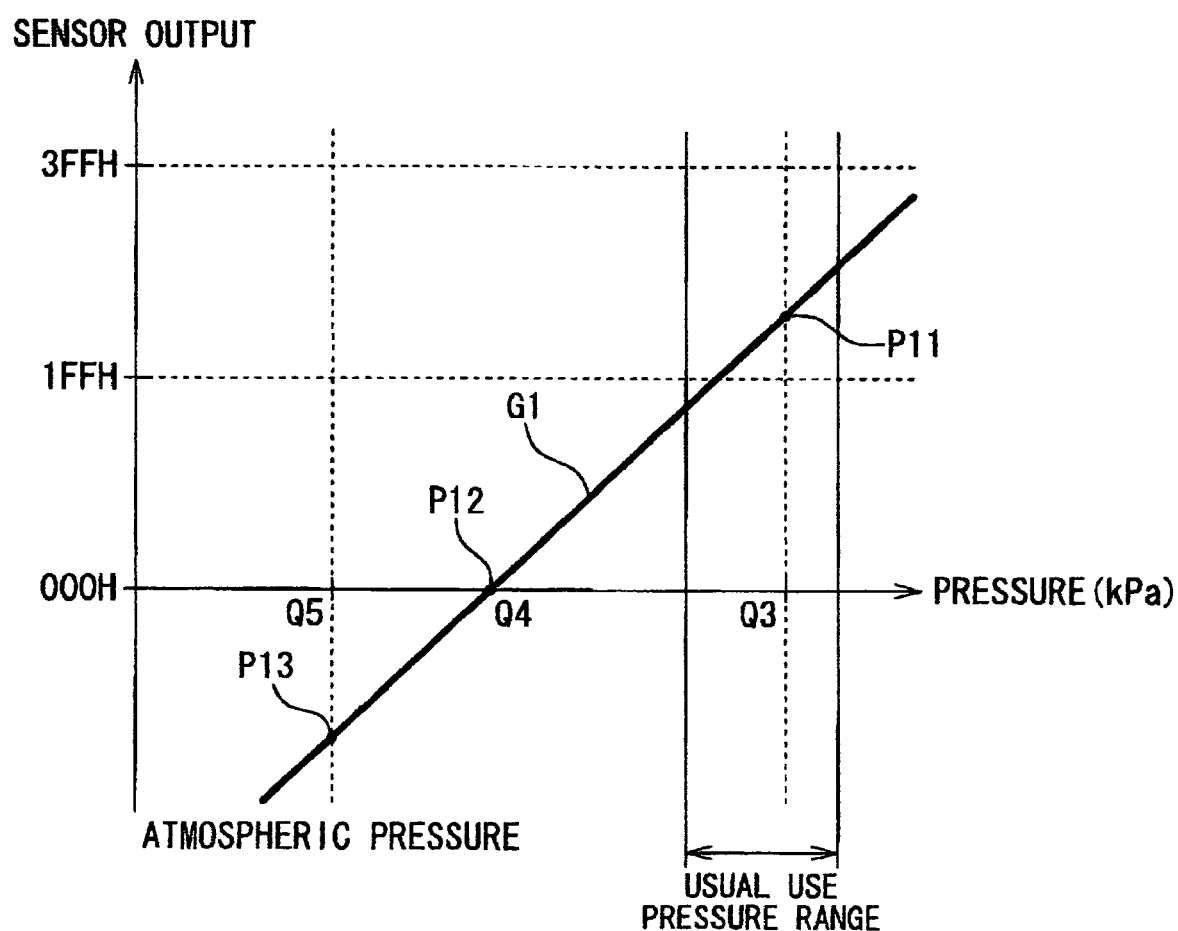
FIG. 11 is a graph showing a relation between an AD conversion value and a pressure.

The operations in the case of upwardly correcting the AD conversion value will be described below with reference to the drawings. FIG. 11 is a graph showing a relation between the AD conversion value and the pressure. A graph G1 indicates the relation between the AD conversion value (corresponding to the sensor output) based on the output voltage outputted from the AD converting circuit 5 and the pressure calculated based on the AD conversion value. When the tire pressure is measured at a high precision, an inclination of the graph G1 (sensor output/pressure (kPa)) is required to be made larger. However, making the inclination of the graph G1 larger makes it difficult to measure the pressure in the range (ex. around atmospheric pressure)

beyond the usual use pressure range. With reference to FIG. 11, when the pressure measurement is executed correspondingly to the graph G1, a pressure value can be specified in the range of the usual use pressure (for example, at a time of a point P11, a pressure value Q3). When the output voltage outputted from the AD converting circuit 5 becomes the voltage at which the AD conversion value corresponds to 000H, a point P12 is specified, and a pressure value Q4 at that time is outputted. Then, the pressure value less than this cannot be specified.

Figure 12:
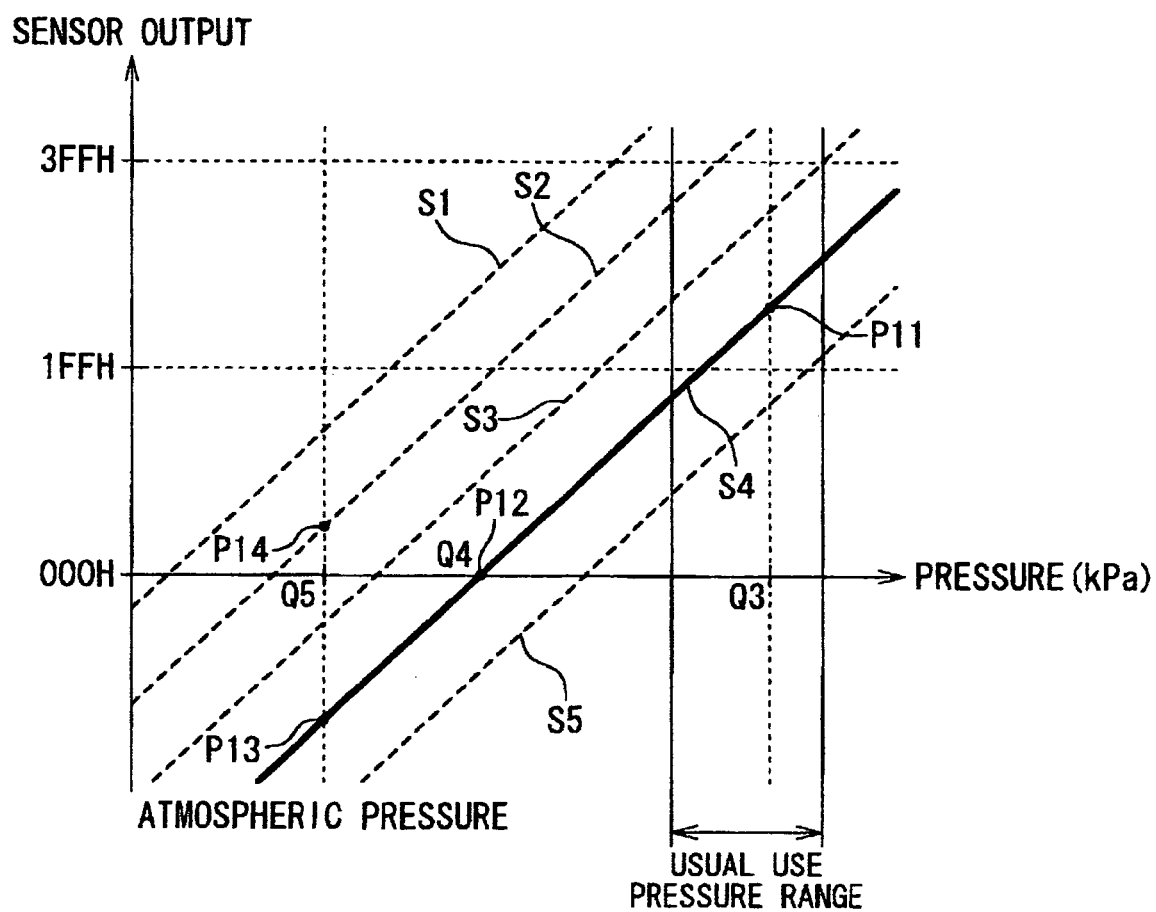
FIG. 12 is a graph exemplifying the another operation in this embodiment.

FIG. 12 is a view concretely showing the operations when the switches in the switch group 49 are switched to change the range. A plurality of graphs (S1 to S5) shown in FIG. 12 correspond to the steps 1 to 5 of the table 70, similarly to FIG. 10. Here, as the initial step, let us suppose that the step 4 (graph S4) is selected. The micro computer 8 receives the output voltage supplied from the AD converting circuit 5 at any time. When the AD converting circuit 5 outputs the voltage indicating 000H as the AD conversion value, the micro computer 8 specifies a pressure value Q4 as a tire pressure at that time.

The micro computer 8 responds to the supply of the voltage indicating 000H as the AD conversion value from the AD converting circuit 5 and outputs the control signal for changing the range. For example, here, let us suppose that the micro computer 8 outputs the control signal for switching the step from the step 4 (graph S4) to the step 2 (graph S2). The amplifying circuit 4 turns off the switch SW4 in response to the control signal and turns on the switch SW2. Thus, the output voltage (corresponding to a point P14) after the switching is supplied to the micro computer 8. The micro computer 8 calculates the AD conversion value based on the supplied voltage and further refers to the table 70 and then calculates the correction value corresponding to the case in which the step is switched by two steps. After that, the micro computer 8 subtracts the correction value from the calculated AD conversion value and calculates the post-correction AD conversion value.

The micro computer 8 specifies a point P13 based on the post-correction AD conversion value obtained by the foregoing calculation and the inclination of the graph S4. The micro computer 8 outputs a pressure value Q5 corresponding to the point P13 as a pressure data. Consequently, even if a voltage (for example, a voltage below the ground voltage (0V)) beyond the input voltage range is supplied to the AD converting circuit 5, switching the range of the AD conversion circuit can enlarge the AD conversion range.

FIG. 13 is a flowchart showing the operations when the table 70 in this embodiment is prepared. The operations indicated in the flowchart are started in relation to the fact that a new input of the correction value 72 of the table 70 is executed or that the data stored in the table 70 is reset. When the table 70 is prepared, let us suppose that a pre-specified constant pressure is applied to the pressure sensor 2.

At a step S201, the micro computer 8 generates the control signal for specifying the initial step and outputs to the amplifying circuit 4. The amplifying circuit 4 turns on a predetermined switch among the plurality of switches (SW1 to SW5) in the switch group 49, in response to the control signal. The amplifying circuit 4 supplies the output voltage at that time to the AD converting circuit 5 in response to the fact that the initial step is specified. The AD converting circuit 5 outputs the output voltage (AD conversion value), into which the output voltage supplied from the amplifying circuit 4 is AD-converted, to the micro computer 8. The micro computer 8 specifies the AD conversion value (measurement value 71) based on the output voltage outputted from the AD conversion circuit 5, relates the AD conversion value (measurement value 71) to the current step (initial step), and then stores in the table 70.

At a step S202, the micro computer a generates the control signal for switching the switch in the switch group 49 in response to the storage completion of the AD conversion value at the current step. Here, the switching between the steps is preferably executed for each step. If a large number of switching operations must be executed because of a large number of switches, the configuration for executing the switching for each of any plurality of steps is allowable. In that case, the measurement value 71 to which the actually measured value is not supplied is preferred to be the calculating method based on a calculation. The AD converting circuit 5 supplies the output voltage after the switching between the switches to the micro computer 8. The micro computer 8 specifies the AD conversion value (measurement value 71) based on the output voltage outputted from the AD converting circuit 5, similarly to the foregoing operations, relates the AD conversion value (measurement value 71) to the current step, and then stores in the table 70.

At a step S203, the micro computer 8 executes a judgment as to whether or not the AD conversion value supplied from the AD converting circuit 5 is 3FFH (or 000H). If the AD conversion value is not 3FFH (or 000H), the process returns and continues to store the AD conversion value (measurement value) at a next step. When the AD conversion value is the 3FFH (or 000H), the AD conversion value exceeds the measurement limit at that step. Therefore, the micro computer 8 stores the step just before current step as the upper limit (or lower limit) in the memory 81 (Step S204). At a step S205, the micro computer 8 calculate the correction value (the difference between the AD conversion values adjacent to each other), from the AD conversion values of the respective steps stored in the memory 81 and stores in the table 70. Here, if the correction values are not calculated correspondingly to all of the steps, the pressure applied to the pressure sensor 2 is changed to then execute the operations at the steps S201 to S205. Since the foregoing operation calculates the correction value to correct the AD conversion value, the accurate AD conversion value can be calculated even if the individual correction values are different from each other.

It is apparent that the present invention is not limited to the above embodiment, that may be modified and changed without departing form the scope and spirit of the invention.

What is claimed is:

1. A semiconductor apparatus, comprising:
   an amplifying unit configured to amplify an input signal to output an amplified signal;
   a bias controlling unit configured to generate a bias voltage to be applied to said input signal;
   an analog-to-digital converting unit configured to analog-to-digital convert said amplified signal into an output signal; and
   a controlling unit configured to output a control signal to said bias controlling unit,
   wherein said controlling unit outputs said control signal when an output value indicated by said output signal is equal to a predetermined value, and
   said bias controlling unit changes said bias voltage in response to said control signal,
   wherein said bias controlling unit discretely changes said bias voltage in response to said control signal,
   said apparatus further comprising a memory configured to store a table including correction data for said output value, wherein said bias controlling unit stores said correction data for said output value before and after said bias voltage is discretely changed.

2. The semiconductor apparatus according to claim 1, wherein said controlling unit calculates a corrected output value corresponding to said changed bias voltage based on said correction data and said output value.

3. The semiconductor apparatus according to claim 1, wherein said predetermined value is one of a maximum value and a minimum value of a conversion range of a bit number of said analog-to-digital converting unit.

4. The semiconductor apparatus according to claim 3, wherein said controlling unit outputs said control signal for decreasing said bias voltage when said output value coincides with said maximum value, and outputs control signal for increasing said bias voltage when said output value coincides with said minimum value.

5. The semiconductor apparatus according to claim 1, wherein said bias voltage is supplied to one of an inverting input terminal and a non-inverting input terminal of an operational amplifier of said amplifying unit.

6. A data transmitting apparatus, comprising:
a sensor; and
a semiconductor apparatus configured to generate a digital data based on a sensor signal outputted from said sensor,
wherein said semiconductor apparatus includes:
an amplifying circuit configured to include an amplifying unit and a bias controlling unit, said amplifying unit amplifies said sensor signal to output an amplified signal, and said bias controlling unit generates a bias voltage to be applied to said sensor signal,
an analog-to-digital converting circuit configured to analog-to-digital convert said amplified signal into an output signal; and
a micro computer configured to output a control signal to said bias controlling unit based on an analog-to-digital conversion value indicated by said output signal,
wherein said micro computer outputs said control signal when said analog-to-digital conversion value is equal to a predetermined value, and
said bias controlling unit changes said bias voltage in response to said control signal, and
said apparatus further comprising a memory configured to store correction data for correcting analog-to-digital conversion values,
wherein said amplifying circuit supplies a corrected amplified signal corresponding to said bias voltage changed in response to said control signal to said analog-to-digital converting circuit,
said analog-to-digital converting circuit generates a corrected analog-to-digital conversion value by analog-to-digital converting said corrected amplified signal, and supplies said corrected analog-to-digital conversion value to said micro computer, and
said micro computer reads a correction data corresponding to said changed bias voltage from said memory in response to said corrected analog-to-digital conversion value, and calculates a real analog-to-digital conversion value based on said read correction data and said corrected analog-to-digital conversion value.

7. The data transmitting apparatus according to claim 6, wherein said micro computer outputs said control signal when said analog-to-digital conversion value is one of a maximum value and a minimum value of a conversion range of said analog-to-digital converting circuit, and said bias controlling unit changes said bias voltage such that said amplified signal is in an input range of said analog-to-digital converting circuit in response to said control signal.

8. A computer program product embodied on a computer-readable medium to operate a data transmitting apparatus used in a tire pressure monitoring system and provided inside a tire, and comprising code that, when executed, causes a computer to perform the following:
controlling a bias controlling unit to generate a bias voltage to be applied to an input signal of an amplifying unit;
controlling an analog-to-digital converting unit to analog-to-digital convert an amplified signal outputted from said amplifying unit into an output signal indicating an analog-to-digital conversion value;
controlling said bias controlling unit to change said bias voltage when said analog-to-digital conversion value is equal to a predetermined value, wherein said controlling said bias controlling unit to change said bias voltage comprises controlling said bias controlling unit to discretely change said bias voltage when said analog-to-digital conversion value is equal to said predetermined value; and
storing correction data for said analog-to-digital conversion values in a memory before and after said bias voltage is changed.

9. The computer program product according to claim 8, further comprising:
calculating a corrected analog-to-digital conversion value corresponding to said changed bias voltage based on said correction data and said analog-to-digital conversion value.

10. The computer program product according to claim 8, wherein said predetermined value is one of a maximum value and a minimum value of a conversion range of a bit number of said analog-to-digital converting unit.

11. The computer program product according to claim 10, wherein said controlling said bias controlling unit to change said bias voltage comprises controlling said bias controlling unit to decrease said bias voltage when said output value coincides with said maximum value, and to increase said bias voltage when said output value coincides with said minimum value.

12. A method for changing a conversion range of an analog-to-digital converting circuit, said method comprising:
generating a bias voltage to be applied to an input signal of an amplifying unit;
analog-to-digital converting an amplified signal outputted from said amplifying unit into an output signal indicating an analog-to-digital conversion value;
changing said bias voltage when said analog-to-digital conversion value is equal to a predetermined value, wherein said changing said bias voltage comprises discretely changing said bias voltage when said analog-to-digital conversion value is equal to said predetermined value;
storing correction data for said analog-to-digital conversion values in a memory before and after said bias voltage is discretely changed; and
calculating a corrected analog-to-digital conversion value corresponding to said changed bias voltage based on said correction data and said analog-to-digital conversion value.

13. The method for changing a conversion range according to claim 12, wherein said predetermined value is one of a maximum value and a minimum value of a conversion range of a bit number of said analog-to-digital converting unit.

14. The method for changing a conversion range according to claim 13, wherein said changing said bias voltage comprises controlling said bias controlling unit to decrease said bias voltage when said output value coincides with said maximum value, and to increase said bias voltage when said output value coincides with said minimum value.

* * * * *